(12) United States Patent
Nomura

(10) Patent No.: US 7,675,150 B2
(45) Date of Patent: Mar. 9, 2010

(54) ELECTRIC CIRCUIT DEVICE AND RELATED MANUFACTURING METHOD

(75) Inventor: Tohru Nomura, Kariya (JP)

(73) Assignee: Denso Corporation, Kariya (JP)

( * ) Notice: Subject to any disclaimer, the term of this patent is extended or adjusted under 35 U.S.C. 154(b) by 301 days.

(21) Appl. No.: 11/806,675

(22) Filed: Jun. 1, 2007

(65) Prior Publication Data
US 2007/0278623 A1 Dec. 6, 2007

(30) Foreign Application Priority Data
Jun. 2, 2006 (JP) .............................. 2006-154433

(51) Int. Cl.
*H01L 21/302* (2006.01)
(52) U.S. Cl. ..................................... 257/685; 257/687
(58) Field of Classification Search ......... 257/678–687, 257/E23.12, E23.127, E23.134
See application file for complete search history.

(56) References Cited
U.S. PATENT DOCUMENTS
5,621,243 A * 4/1997 Baba et al. .................. 257/712
2008/0111151 A1 * 5/2008 Teraki et al. ................. 257/714

FOREIGN PATENT DOCUMENTS
JP 09-246430 9/1997

* cited by examiner

*Primary Examiner*—Cuong Q Nguyen
(74) *Attorney, Agent, or Firm*—Nixon & Vanderhye

(57) ABSTRACT

An electric circuit device and related manufacturing method are disclosed as having a case incorporating therein a substrate on which electric circuit elements are mounted. A sealant is filled in the case to cover the electric circuit elements and the substrate and is composed of a lower layer gel and an upper layer gel formed in a two-layer structure. The upper layer gel has a penetration equal to or less than 90 and the lower layer gel has a penetration greater than that of the upper layer gel to allow the upper layer gel to suppress vibration of a surface of the lower gel for thereby suppressing the deformation of the lower layer gel even in the presence of a tendency causing the electric circuit elements or the substrate to vibrate, preventing a degraded function in insulation, waterproof and vibrational relaxation of the lower layer gel.

11 Claims, 3 Drawing Sheets

| PENETRATION OF GEL | SOFTENING(LIQUEFYING) DEGREE ON VIBRATION TEST | EXISTENCE OF GEL CRACKING ON THERMAL TEST |
|---|---|---|
| 130 | 3~5(−) | + |
| 120 | 2~3(−) | + |
| 110 | 1(−) | + |
| 100 | 0.1(+) | + |
| 90 | 0.05(+) | + |
| 80 | 0.04(+) | + |
| 70 | 0.03(+) | + |
| 60 | 0.01(+) | + |
| 50 | 0.01(+) | − |
| 40 | 0.01(+) | − |
| 30 | 0.01(+) | − |

| PENETRATION | YOUNG'S E (Pa) |
|---|---|
| 130 | 70 |
| 100 | 200 |
| 90 | 300 |
| 60 | 1400 |

ELECTRIC CIRCUIT DEVICE AND RELATED MANUFACTURING METHOD

CROSS REFERENCE TO RELATED APPLICATIONS

This application is related to Japanese Patent Application No. 2006-154433, filed on Jun. 2, 2006, the content of which is hereby incorporated by reference.

BACKGROUND OF THE INVENTION

1. Technical Field of the Invention

The present invention relates to electric circuit devices for electric circuit substrates on which electric circuit elements are mounted and, more particularly, to an electric circuit device having a case filled with gel to seal an electric circuit substrate and associated electric circuit elements for performing insulation, waterproof and vibrational relaxation of the electric circuit elements.

2. Description of the Related Art

In the related art, an attempt has heretofore been made to provide an electric circuit device having a case filled with gel to seal an electric circuit substrate and associated electric circuit elements for performing insulation, waterproof and vibrational relaxation of the electric circuit elements. Under a circumstance where such an electric circuit device is installed on an internal combustion engine of, for instance, a vehicle, it follows that the electric circuit device operates under severe environments. Especially, under a situation where the electric circuit device is installed in an engine room, the electric circuit device is subjected to a severe heat environment. Moreover, in a case where the electric circuit device is installed on an engine body, it follows that the electric circuit device operates under an extremely severe heat environment.

Under such environments, the electric circuit substrate or the associated electric circuit elements vibrate at increased rates. This causes gel, filled inside the case, to be softened (liquefied), resulting in a functional degradation in insulation, waterproof and vibrational relaxation of the associated component parts. Under such circumstances, a short-circuiting is caused to occur in somewhere in the electric circuit or moisture intrudes to an area around connecting parts. This results in the occurrence of corrosion and disconnection in relevant conducting parts. This causes an issue to arise with the resultant increase in the vibrations of associated component parts and disconnections in bonding areas.

To address the above issues, an attempt has heretofore been made to fill the case with sealants in two layers with a view to preventing damage to internal elements caused by external vibrations, that is, especially, the disconnection of a bonding area (see, for instance, Japanese Patent Application Publication 9-246430). With such a sealant structure, a lower layer gel is covered with resin formed as an upper layer. The upper layer is structured with hard resin with a complex elastic modulus of 0.3 MPa for thereby preventing the vibrations of electric circuit elements or electric circuit substrate.

However, with the upper layer made of resin with such a particular complex elastic modulus, the upper layer bears cracking under cold environment. This causes a drop in vibrational relaxation effect of the upper layer after the occurrence of cracking. This results in a difficulty of preventing the softening of gel in the lower layer and no issue can be addressed. In addition, since the sealant is composed of the upper layer, made of resin, and the lower layer made of gel, a less bonding effect exists between the upper layer and the lower layer is weak. This causes a separation to occur on a boundary layer between these two layers and the vibrational relaxation decreases, resulting in a difficulty of addressing the above issues.

SUMMARY OF THE INVENTION

The present invention has been completed with a view to addressing the above issues and has an object to provide an electric circuit device and a method of manufacturing an electric circuit device that can prevent a drop in functions such as insulation, waterproof and vibrational relaxation effects of gel filled in a case due to vibrations of electric circuit elements or an electric circuit substrate.

To achieve the above object, a first aspect of the present invention provides an electric circuit device comprising a case, a substrate on which electric circuit elements are mounted and which is mounted in the case, and a sealant, filled in the case to cover the electric circuit elements and the substrate, which takes a two-layer structure having a lower layer gel and an upper layer gel. The upper layer gel has a penetration equal to or less than 90 and the lower layer gel has a penetration greater than that of the upper layer gel.

With the sealant formed in such a two-layer structure composed of the upper layer gel and the lower layer gel with the upper layer gel having the penetration equal to or less than 90, the upper layer gel can suppress the amplitude of the surface of the lower layer gel. Therefore, even if the electric circuit elements or the substrate tend to vibrate, the deformation of the lower layer gel per se is suppressed, enabling the prevention of the electric circuit elements or the substrate from vibrating. This makes it possible to suppress the occurrence of the softening of the lower gel, preventing the occurrence of degraded function such as insulation, waterproof and vibrational relaxation effects of the lower layer gel.

With the electric circuit device of the present embodiment, the upper layer gel may preferably have the penetration equal to or greater than 60. If the upper layer gel is too hard, then, the upper layer gel is susceptible to gel cracking depending on variations in temperature. Accordingly, with the upper layer gel set to have the penetration equal to or greater than 60, almost no gel cracking takes place in the upper layer gel even in the presence of the variations in temperature.

With the electric circuit device of the present embodiment, the lower layer gel may preferably have the penetration equal to or greater than 100. If the lower layer gel is too hard, then, there is a probability for damages to occur in electrically connected portions such as bonding portions or soldered portions or the like of the mounted electric circuit elements. Accordingly, the use of the lower layer gel with the penetration equal to or greater than 100 makes it possible to prevent the occurrence of such damages to the electrically connected portions.

With the electric circuit device of the present embodiment, the lower layer gel may preferably have the penetration equal to or less than 130. The lower layer gel needs to have hardness (viscosity) to the extent of exhibiting a function to perform vibrational relaxations of the electric circuit elements and the substrate. In considering such a need, the lower layer gel may preferably have the penetration equal to or less than 130.

With the electric circuit device of the present embodiment, the upper layer gel and the lower layer gel may preferably include silicone gel.

With the electric circuit device of the present embodiment, the upper layer gel and the case may preferably have a bottom wall and sidewalls to allow the substrate to be fixedly secured onto the bottom wall; the case also has an upper wall portion, placed over the substrate, which carries thereon an electric circuit element; and the upper layer gel is filled in the case so as to cover at least a part of the base.

With the electric circuit device of such a structure, the base is placed in a floating condition to be spaced from the bottom wall, resulting in a structure that is easy to vibrate. With the upper layer gel taking a structure to cover at least a part of the base, the hard upper layer gel can suppress the vibration of the base. This makes it possible to prevent the softening of gel caused by the vibration of the base.

Another aspect of the present invention provides an electric circuit device comprising a case, a substrate on which electric circuit elements are mounted and which is mounted in the case, and a sealant, filled in the case to cover the electric circuit elements and the substrate, which takes a two-layer structure having a lower layer gel and an upper layer gel, wherein the upper layer gel has a penetration equal to or less than 90 and the lower layer gel has a penetration equal to or greater than 100 and equal to or less than 130.

With the electric circuit device of such a structure, the sealant is formed in the two-layer structure composed of the upper layer gel with the penetration equal to or less than 90 and the lower layer gel with the penetration equal to or greater than 100 and equal to or less than 130. Therefore, even if the electric circuit elements or the substrate tend to vibrate, the deformation of the lower layer gel per se is suppressed, enabling the prevention of the electric circuit elements or the substrate from vibrating. This makes it possible to suppress the occurrence of the softening of the lower gel, preventing the occurrence of degraded function such as insulation, waterproof and vibrational relaxation effects of the lower layer gel.

Another aspect of the present invention provides an electric circuit device comprising a case, a substrate on which electric circuit elements are mounted in a first group and which is mounted in the case, a sealant, filled in the case to cover the electric circuit elements and the substrate, which takes a two-layer structure having a lower layer gel and an upper layer gel, and a resin base fixedly mounted in the case in an area straddling the first group of electric circuit elements and the substrate and including sidewalls extending through the upper and lower layer gels of the sealant and an element mounting portion supported with at least one of the sidewalls for fixedly supporting thereon an electric circuit element belonging to a second group at a position covered with the upper layer gel. The upper layer gel has a penetration equal to or less than 90 and the lower layer gel has a penetration equal to or greater than 100 and equal to or less than 130.

With the electric circuit device of such a structure, the sealant is formed in the two-layer structure composed of the upper layer gel with the penetration equal to or less than 90 and the lower layer gel with the penetration equal to or greater than 100 and equal to or less than 130. In addition, the resin base has the element mounting portion buried in the upper layer gel and fixedly supporting the electric circuit element belonging to the second group. Therefore, even if the electric circuit elements belonging to the first group, the substrate and the resin base tend to vibrate, the deformation of the lower layer gel per se is suppressed, enabling the prevention of the electric circuit elements or the substrate from vibrating. Also, since the resin base is covered with the upper layer gel, less vibration is caused to occur on the electric circuit element belonging to the second group. This makes it possible to suppress the occurrence of the softening of the lower gel, preventing the occurrence of degraded function such as insulation, waterproof and vibrational relaxation effects of the lower layer gel. Moreover, the provision of the resin base permitting the electric circuit element belonging to the second group to be mounted in an area different from the substrate results in increased integration of the hybrid circuit elements with a reliable sealing effect.

Another aspect of the present invention provides a method of manufacturing an electric circuit device comprising preparing a case, fixedly mounting a substrate, on which electric circuit elements are mounted, to the case, filling a lower layer gel into the case so as to cover the electric circuit elements and the substrate, and filling an upper layer gel into the case so as to cover the lower layer gel to form a sealant in a two-layer structure. The upper layer gel has a penetration equal to or less than 90 and the lower layer gel has a penetration equal to or greater than 100 and equal to or less than 130.

With the method of manufacturing the electric circuit device mentioned above, the sealant is formed in the two-layer structure composed of the upper layer gel with the penetration equal to or less than 90 and the lower layer gel with the penetration equal to or greater than 100 and equal to or less than 130. Therefore, even if the electric circuit elements or the substrate tend to vibrate, the deformation of the lower layer gel per se is suppressed, enabling the prevention of the electric circuit elements or the substrate from vibrating. This makes it possible to suppress the occurrence of the softening of the lower gel, preventing the occurrence of degraded function such as insulation, waterproof and vibrational relaxation effects of the lower layer gel.

A further aspect of the present invention provides a method of manufacturing an electric circuit device comprising preparing a case, fixedly mounting a substrate, on which electric circuit elements are mounted, to the case, fixedly mounting a resin base to the case in an area straddling the first group of electric circuit elements and the substrate, the resin base including sidewalls and an element mounting portion supported with at least one of the sidewalls for fixedly supporting thereon an electric circuit element belonging to a second group, filling a lower layer gel into the case so as to cover the electric circuit elements, the substrate and partial areas of the sidewalls of the resin base, and filling an upper layer gel into the case so as to cover the lower layer gel to form a sealant in a two-layer structure such that the element mounting portion of the resin base is buried in the upper layer gel so as to support at least a part of the electric circuit element belonging to the second group. The upper layer gel has a penetration equal to or less than 90 and the lower layer gel has a penetration equal to or greater than 100 and equal to or less than 130.

With the method of manufacturing the electric circuit device set forth above, the sealant is formed in the two-layer structure composed of the upper layer gel with the penetration equal to or less than 90 and the lower layer gel with the penetration equal to or greater than 100 and equal to or less than 130. In addition, the resin base has the element mounting portion buried in the upper layer gel and fixedly supporting the electric circuit element belonging to the second group. Therefore, even if the electric circuit elements belonging to the first group, the substrate and the resin base tend to vibrate, the deformation of the lower layer gel per se is suppressed, enabling the prevention of the electric circuit elements or the substrate from vibrating. Also, since the resin base is covered with the upper layer gel, less vibration is caused to occur on the electric circuit element belonging to the second group. This makes it possible to suppress the occurrence of the softening of the lower gel, preventing the occurrence of degraded function such as insulation, waterproof and vibrational relaxation effects of the lower layer gel. Moreover, the provision of the resin base permitting the electric circuit element belonging to the second group to be mounted in an area different from the substrate results in increased integration of the hybrid circuit elements with a reliable sealing effect.

BRIEF DESCRIPTION OF THE DRAWINGS

FIGS. 3A and 3B are cross sectional views of frame formats showing a method of manufacturing the electric circuit device shown in FIG. 1, with FIG. 3A showing a step of forming a lower layer gel of a sealant while FIG. 3B shows a step of forming an upper layer gel of the sealant.

DETAILED DESCRIPTION OF PREFERRED EMBODIMENTS

Figures 1, 2:
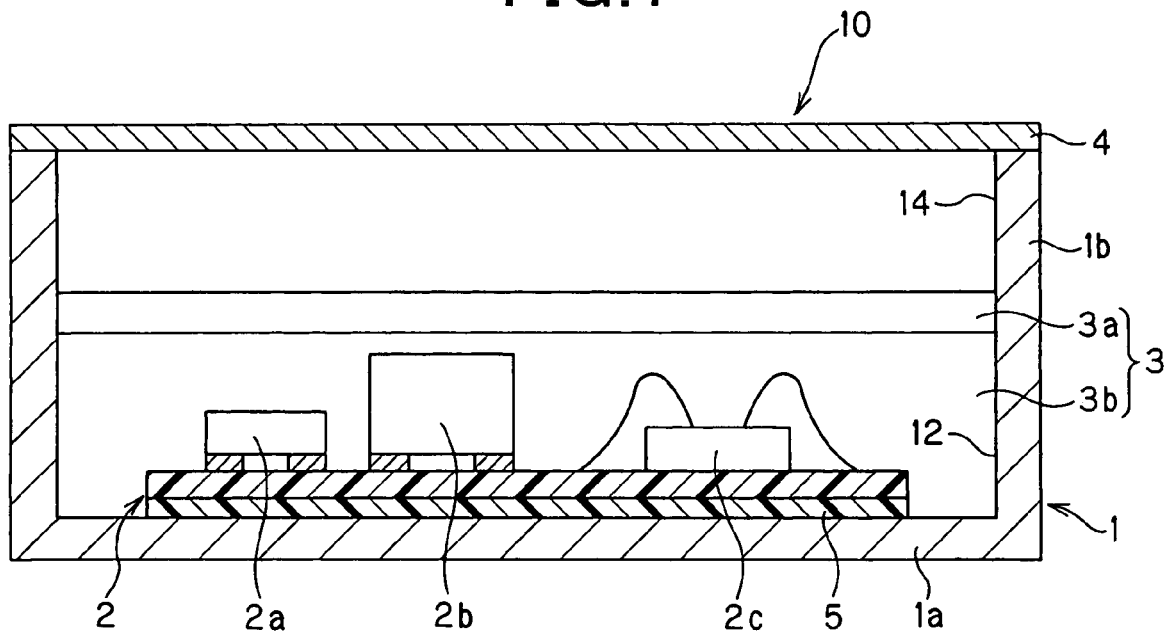
FIG. 1 is a cross sectional view showing an electric circuit device of a first embodiment according to the present invention.
FIG. 2 is a diagram showing the relationship among a penetration of gel, the degree of softening (liquefying) of gel, and the presence of or absence of gel cracking when conducting a vibrating test and thermal test.

Now, electric circuit devices of various embodiments according to the present invention will be described below in detail with reference to the accompanying drawings. However, the present invention is construed not to be limited to such an embodiment described below and technical concepts of the present invention may be implemented in combination with other known technologies or the other technology having functions equivalent to such known technologies.

In the following description, like reference characters designate like or equivalent corresponding parts throughout the several views.

First Embodiment

An electric circuit device of a first embodiment according to the present invention is described below. FIG. 1 is a cross sectional view showing the electric circuit device of the present embodiment to which the present invention is applied. Hereunder, the electric circuit device of the present embodiment will be described in detail.

The electric circuit device of the present embodiment is used as a hybrid integrated circuit adapted to be mounted in an engine room or an engine body for performing engine control.

As shown in FIG. 1, the electric circuit device 10 includes a case 1 in which an electric circuit substrate 2 is mounted. The case 1 has an upper end on which a top cover 4 is placed to cover an intervening sealant 3 with which the electric circuit substrate 2 is covered.

The case 1 is made of metal such as, for instance, aluminum, copper or the like. With the present embodiment, the case 1 is formed of a rectangular body member having a hollow section 12 defined with a bottom wall 1a and sidewalls 1b extending upright at four peripheral edges of the bottom wall 1a. The top cover 4, made of suitable material such as iron, poly phenylene sulfide (PPS) or propylene terephthalate (PPT), has an open end 14 that is closed with the top cover 4. The cover 4 is located in contact with an upper end face of the sidewall 1b and fixedly secured to the case 1 by means of suitable fastening means such as screw tightening or adhesives.

The electric circuit substrate 2 includes a substrate, made of alumina, which has wiring patterns on which electric circuit elements of various kinds are mounted. The electric circuit substrate 2 is fixedly secured onto the bottom wall 1a of the case 1 by means of a silicone adhesive layer 5. Examples of the electric circuit elements, mounted on the electric circuit substrate 2, include a chip capacitor 2a, a chip resistor 2b and a monolithic IC 2c, etc., and, in addition thereto, power semiconductor elements (not shown). With the electric circuit elements connected to each other through the wiring patterns formed on the electric circuit substrate 2, an electric circuit structure is formed for performing desired engine control.

The intervening sealant 3 is structured with an upper layer gel 3a, facing the top cover 4, and a lower gel layer 3b covering the electric circuit substrate 2.

The upper layer gel 3a, made of gel material that is harder than that of the lower gel layer 3b, serves to cover the lower gel layer 3b so as to suppress an amplitude of a surface of the lower gel layer 3b. The upper layer gel 3a is formed in a thickness of, for instance, a value approximately ranging from 2 to 4 mm. Due to the upper layer gel 3a acting on the lower gel layer 3b so as to suppress the amplitude thereof, no deformation of the lower gel layer 3b per se takes place even when the electric circuit elements 2a to 2c or the electric circuit substrate 2 tend to vibrate. This suppresses the vibrations of these component parts.

More particularly, the upper layer gel 3a is made of gel such as, for instance, silicone gel with a penetration equal to or greater than 60 and equal to or less than 90 as a result of measurement with a penetrometer used in measuring a gel hardness.

The lower gel layer 3b is formed in a depth to the extent to allow gel to penetrate to areas around the electric circuit elements 2a to 2c. The presence of the lower gel layer 3b achieves insulation, waterproof and vibrational relaxation of the electric circuit elements 2a to 2c and the wiring patterns or the like formed on the electric circuit substrate 2.

More particularly, the lower gel layer 3b is made of gel with a penetration equal to or greater than 100 and equal to or less than 130 in a value measured with the penetrometer. With the present embodiment, the lower gel layer 3b is made of the same material as that of the upper layer gel 3a.

With the present embodiment, the penetrations of the upper layer gel 3a and the lower gel layer 3b are specified for the reasons described below.

FIG. 2 shows the relationship among a penetration of gel, a softening (liquefying) level as a result of a vibration test and the presence of or absence of a gel cracking as a result of a thermal test.

As used herein, the term "vibration test" refers to a test that is conducted by applying vibration to gel with an envisioned environment in mind for gel to be used. In the relationship shown in FIG. 2, a second column indicates a resultant softening degree of gel in a numeric value with symbol "+" in a bracket representing the absence of softening of gel and "−" in the bracket representing the presence of softening of gel. This represents such that the lower the numeric value, the lower will be the softening degree. In conducting the vibration test, gel is applied with a vibrating acceleration at a rate of, for instance, 10 G (30 G depending on a status of use).

In addition, as used herein, the term "thermal test" refers to a cycle test conducted with an envisioned temperature environment in mind for gel to be used. Here, the existence of a resultant gel cracking is indicated in symbols "+" representing the absence of gel cracking and "−" representing the presence of gel cracking for the result appeared upon conducting thermal heat cycles at a repetition frequency of 1000 times with temperatures varied in a range from −40 to 150° C.

To enable the upper layer gel 3a to exhibit a function to suppress the amplitude of the surface of the lower gel layer 3b, the upper layer gel 3a needs to have hardness such that almost no softening occurs even if applied with the vibration. On that note, to look at the result of the softening degree coming from the vibration test shown in FIG. 2, it is turned out that with gel having the penetration of 90, almost no softening occurs in the lower layer gel 3b. Accordingly, on selecting the upper layer gel 3a to have the penetration of at least a value less than 90, it becomes possible for the upper layer gel 3a to have hardness with no occurrence of the lower layer gel 3b being softened even if applied with the vibration.

Further, if the upper layer gel 3a is of the type subjected to gel cracking depending on the temperature environment for gel to be used, the issue arises as set forth above. Therefore, the upper layer gel 3a needs to have characteristics not to undergo gel cracking due to temperature variation. In view of the results on the cold thermal test shown in FIG. 2, it is confirmed that gel cracking occurs in the upper layer gel 3a with the penetration less than 60 (with the penetration laying at values of 40 and 30 in the illustrated results). Accordingly, the upper layer gel 3a is selected to have the penetration higher than at least 60, making it possible to have a consequence with almost no gel cracking taking place even in the presence of the temperature variation.

Meanwhile, the upper layer gel 3a suppresses the vibration of the lower layer gel 3b. Therefore, a need arises for the lower layer gel 3b to take priority to the addressing of issues on damages to the electrical connections such as bonding areas, soldered areas or the like of the mounted electric circuit elements 2a to 2c due to the lower layer gel 3b selected to be too hard rather than addressing the issue of the softening result.

That is, the lower layer gel 3b, penetrated deep into intervening areas beneath the chip capacitor 2a and the chip resistor 2b, is subjected to thermal expansion to apply a stress against the electrical connections. This causes a damage to occur in the electrical connections. Such an issue can be addressed by determining the relationship between the penetration of the lower layer gel 3b and the electrical connections. Therefore, the lower layer gel 3b may suffice to have a penetration determined in conformity to such relationship. That is, it is already confirmed that no issue arises if the lower layer gel 3b has the penetration of, for instance, a value greater than at least 100.

However, the lower layer gel 3b has another need to have hardness (viscosity) to the extent that allows a function to be exhibited for performing vibrational relaxations of the electric circuit elements 2a to 2c and the electric circuit substrate 2. Considering such a function, the lower layer gel 3b may preferably have a penetration less than 130.

In view of the studies set forth above, the upper layer gel 3a is selected to have the penetration in a value equal to or greater than 60 and equal to or less than 90 and the lower layer gel 3b is selected to have the penetration in a value equal to or greater than 100 and equal to or less than 130.

Now, a method of manufacturing the electric circuit device of the present embodiment will be described below. In addition, the method of manufacturing the electric circuit device includes the same steps as those of the related art method of manufacturing the electric circuit device except for a step of forming the sealant 3. Therefore, a description will be made with a focus on the step of forming the sealant 3.

Figure 3A:
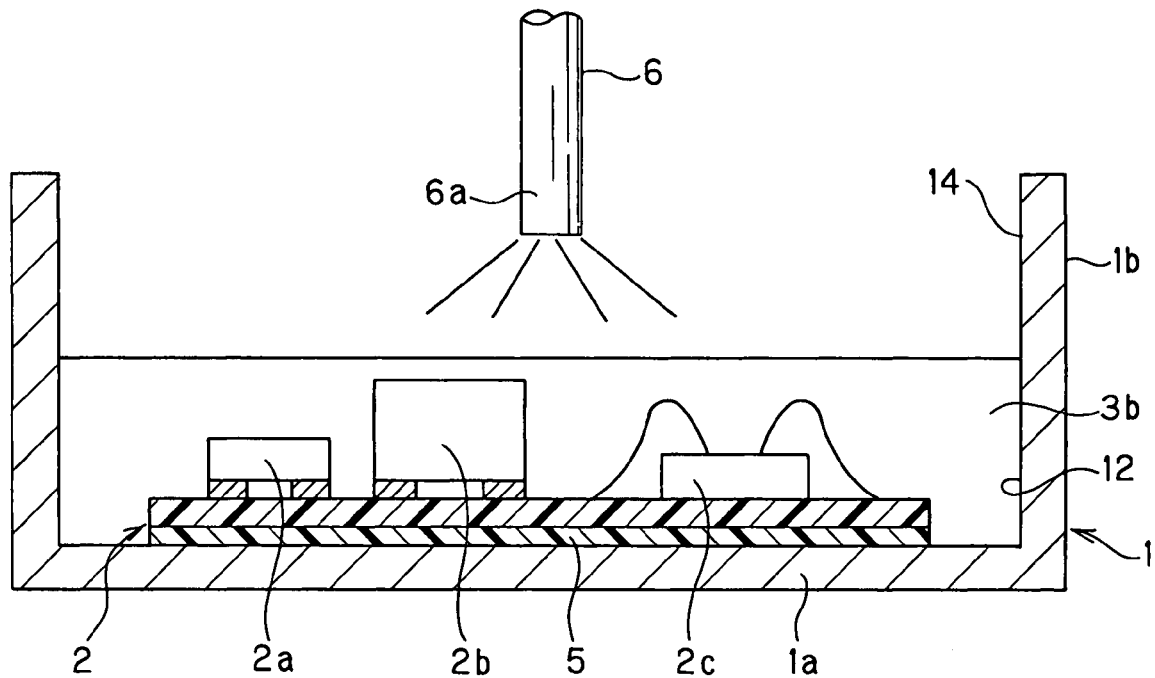
Figure 3B:
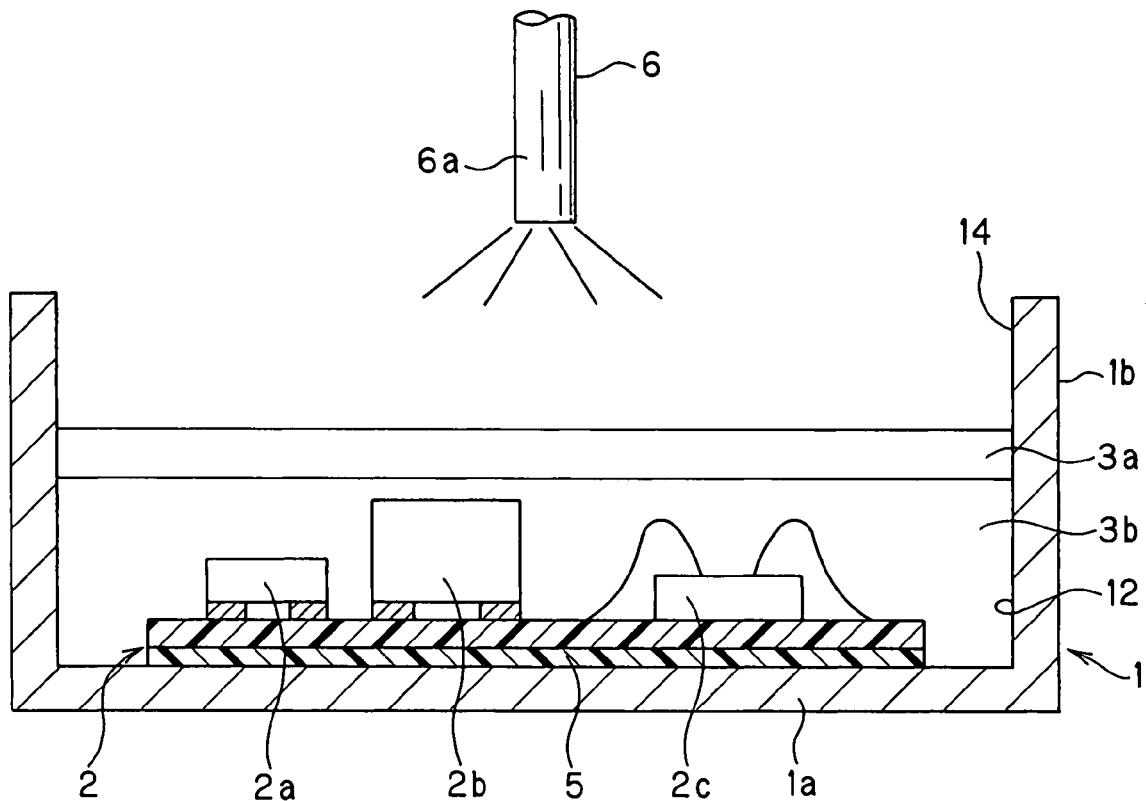

FIG. 3A is a frame format in cross section showing how the step of forming the lower layer gel 3b is performed for forming a part of the sealant 3. FIG. 3B is a frame format in cross section showing how the step of forming the upper layer gel 3a is performed for forming another part of the sealant 3.

As shown in FIG. 3A, first, the electric circuit substrate 2 on which the electric circuit elements 2a to 2c are mounted is prepared. Then, adhesive 5 is coated on the surface of the bottom wall 1a of the case 1 and the electric circuit substrate 2 is placed on adhesive 5 to fixedly secure the electric circuit substrate 2 onto the bottom wall 1a of the case 1. Thereafter, a gel injection device 6 is set to allow a gel injection port 6a of the gel injection device 6 to be placed inside the open end 14 of the case 1. Then, the gel injection device 6 is operated to allow the gel injection port 6a to inject gel, selected to have a penetration equal to or greater than 100 and equal to or less than 130, to the hollow section 12 of the case 1.

Thus, the lower layer gel 3b is formed in the hollow section 12 of the case 1 to cover the electric circuit elements 2a to 2c and the electric circuit substrate 2 in a sealed state. During such injecting step, reactive components of gel are adjusted so as to regulate the amount of bonding groups for molecular termini to form gel. This enables gel to have the penetration equal to or greater than 100 and equal to or less than 130.

In consecutive step shown in FIG. 3B, the gel injection device 6 is operated again to cause the gel injection port 6a to inject gel with a penetration equal to or greater than 60 and equal to or less than 90 to the inside of the case 1. Thus, the upper layer gel 3a is formed on the lower layer gel 3b. During such injecting step, the gel injection device 6 is regulated to adjust the reactive components of gel for adjusting the amount of bonding groups for molecular termini to form gel in the same manner as that achieved in forming the lower layer gel 3b.

More particularly, the gel injection device 6 is regulated so as to allow the upper layer gel 3a to have a larger quantity of reactive components of gel than that prepared for gel of the lower layer gel 3b. This enables gel to be adjusted with a penetration equal to or greater than 90 and equal to or less than 130.

With the electric circuit device of the present embodiment set forth above, the upper layer gel 3a suppresses the amplitude of the surface of the lower layer gel 3b. Therefore, even if the electric circuit elements 2a to 2c and the electric circuit substrate 2 tend to vibrate, the deformation of the lower layer gel 3b per se can be minimized. This makes it possible to suppress the vibrations of the associated component parts. Consequently, it becomes possible to preclude the lower layer gel 3b from being softened. This results in capability of preventing the occurrence of degradations in insulation, waterproof and vibrational relaxation of the lower layer gel 3b.

Further, the upper layer gel 3a is set to have the penetration not to cause almost no softening of the upper layer gel 3a, even if applied vibration, and no occurrence of gel cracking due to the temperature variation. This provides capability of preventing the cracking of resin caused under cold temperature environments accompanied by degraded vibrational relaxation effect due to the cracking of resin. Thus, it becomes possible to address the issue of a difficulty in preventing the softening of the lower layer gel 3b.

With the electric circuit device of the present embodiment, further, the sealant 3 is takes the form of a double layer structure composed of the upper layer gel 3a and the lower layer gel 3b both of which are made of gel. The upper layer gel 3a and the lower layer gel 3b have high adhesion properties (bonding abilities) with no occurrence of separation between the adjacent layers on a boundary layer therebetween with no occurrence of degraded vibrational relaxation effect. This makes it possible for the lower layer gel 3b to perform further increased vibrational relaxation effect. This precludes the softening of the lower layer gel 3b, preventing the occurrence of degraded functions such as insulation, waterproof and vibrational relaxation of the lower layer gel 3b.

Figures 4, 5:
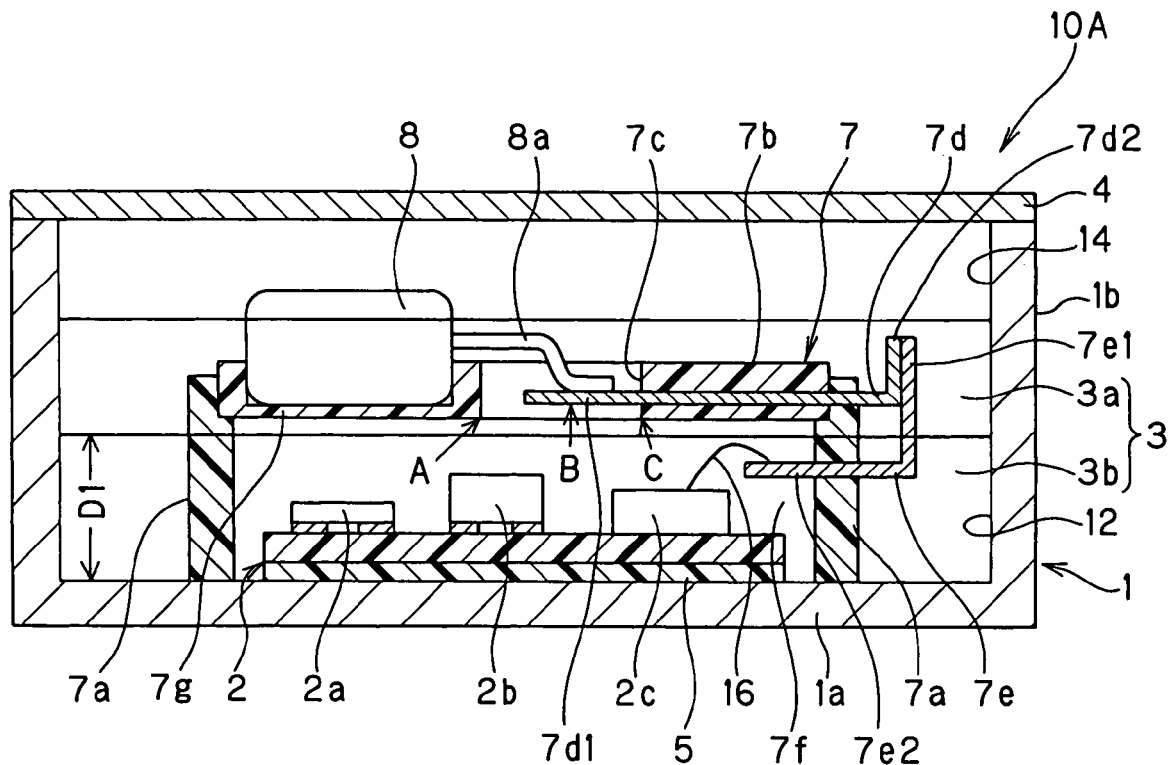
FIG. 4 is a diagram showing the relationship between a penetration of gel and a Young's modulus.
FIG. 5 is a cross sectional view showing an electric circuit device of a second embodiment according to the present invention.

While the present embodiment employs the penetration of gel that is a general parameter in a field of gel for the purpose of specifying hardness of the upper layer gel 3a and the lower layer gel 3b, the penetration may be subjected to Young' modulus conversion. FIG. 4 shows an example of a conversion table for the penetration of gel and the Young' modulus to be converted.

Second Embodiment

An electric circuit device of a second embodiment according to the present invention is described with reference to FIG. 5. The electric circuit device of the present embodiment has the same structure as that of the electric circuit device of the first embodiment except for a resin base for holding an additional electric circuit element. Therefore, a description of the second embodiment will be made with a focus on differing features.

FIG. 5 is a cross sectional view showing the electric circuit device of the present embodiment.

As shown in FIG. 5, the electric circuit device 10A of the present embodiment includes the resin base 7 that is fixedly mounted on the bottom wall 1a inside the case 1.

That is, the resin base 7 is made of, for instance, poly phenylene sulfide (PPS) and placed in an area over the electric circuit substrate 2 so as to straddle an area over the electric circuit substrate 2 and the electric circuit elements 2a to 2c. In particular, the resin base 7 includes a pair of sidewalls 7a, standing upright from the surface of the bottom wall 1a of the case 1 at horizontally spaced positions, and an upper wall portion 7b fixedly supported with the sidewalls 7a on upper portions thereof. The sidewalls 7a have bottom surfaces fixed to the bottom wall 1a to allow the upper wall portion 7b to be placed over the electric circuit substrate 2.

The upper wall portion 7b of the resin base 7 is integrally formed with an element mounting portion 7g on which an electric circuit element such as an electrolytic capacitor 8 is mounted.

More particularly, the upper wall portion 7b of the resin base 7 is formed with a window portion 7c in which a lead wire 8a of the electrolytic capacitor 8 is located. In addition, a bus bar 7d is unitarily formed with the upper wall portion 7b of the resin base 7 so as to laterally extend in a direction parallel to the plane of the upper wall portion 7b such that the bus bar 7d has a terminal end 7d1 exposed to the window portion 7c for electrical connection to one end of the lead wire 8a.

The bus bar 7d has the other end portion extending through the sidewall 7a and bent upward to form an upright terminal end 7d2, which is bonded to an upper end 7e1 of a bus bar 7e. The bus bar 7e protrudes through the sidewall 7a into an inside area 7f of the resin base 7. Under such a state, an inner end terminal 7e2 of the bus bar 7e is electrically connected to the monolithic IC2 through a bonding wire 16.

With such a structure of the resin base 7, the electric component element, which cannot be mounted on the electric circuit substrate 2, is placed on the upper wall portion 7b of the resin base 7 to enable the electric circuit elements to be mounted in a double-layer structure to achieve a space-saving ability.

With the electric circuit device of the present embodiment formed in such a structure, the resin base 7 remains in a floating state under a structure to be easily vibrational. No supporting structure is present in the window portion 7c for supporting corner areas A and C of the resin base 7 or a joint section B between the lead 8a and the bus bar 7d and a portion C of the end portion 7d1. These areas are weak in structure and easy to vibrate, causing gel to be easily softened in such areas.

With the present embodiment, therefore, the electric circuit device 10A takes the form of a structure in which the lower layer gel 3b is filled in the hollow section 12 of the case 1 in a depth D1 in which an upper surface of the lower layer gel 3b is spaced from a bottom surface of the upper wall portion 7b of the resin base 7 while the resin base 7 is surrounded with the upper layer gel 3a. With the electric circuit device 10A formed in such a structure, the present embodiment has the same advantageous effects as those of the first embodiment. In addition, the upper layer gel 3a is able to suppress the vibration of the resin base 7, thereby making it possible to prevent the softening of gel caused by the vibration of the resin base 7.

With the present embodiment, therefore, the electric circuit device 10A takes the form of a structure wherein the lower layer gel 3b is filled in the hollow section 12 in depth of D1 that causes the surface of the lower layer gel 3b not to reach the resin base 7 to allow the upper layer gel 7 to cover the resin base 7. Such a structure enables the electric circuit device 10A of the present embodiment to have the same advantages effects as those of the electric circuit device 10 of the first embodiment. Thus, the hard upper layer gel 3a can suppress the occurrence of vibration of the resin base 7, making it possible to prevent the softening of gel caused by the vibration of the resin base 7.

(Modified Form)

While the present invention has been exemplarily described with reference to various embodiments related to the electric circuit substrate 2 and the associated electric circuit elements 2a to 2c mounted thereon, it is to be construed that these embodiments represent mere exemplary cases and may be implemented in other structures. Of course, it is intended that various materials, used for various component parts forming the electric circuit device, be considered only as illustrative of the present invention and it doesn't matter if other materials are used.

While the electric circuit device of the second embodiment has been described with reference to a structure wherein the resin base 7 is covered with the upper layer gel 3a, the present invention is not limited to such a structure. That is, an alternative may be structured such that at least a part of the resin base 7 may be covered with the upper layer gel 3a with a resultant advantageous effect of having the vibrational relaxation effect of the resin base 7.

What is claimed is:

1. An electric circuit device comprising:
a case;
a substrate on which electric circuit elements are mounted and which is mounted in the case; and
a sealant, filled in the case to cover the electric circuit elements and the substrate, which takes a two-layer structure having a lower layer gel and an upper layer gel;
wherein the upper layer gel has a penetration equal to or less than 90 and the lower layer gel has a penetration greater than that of the upper layer gel.

2. The electric circuit device according to claim 1, wherein: the upper layer gel has the penetration equal to or greater than 60.

3. The electric circuit device according to claim 1, wherein: the lower layer gel has the penetration equal to or greater than 100.

4. The electric circuit device according to claim 1, wherein:
the lower layer gel has the penetration equal to or less than 130.

5. The electric circuit device according to claim 1, wherein:
the case has a bottom wall and sidewalls to allow the substrate to be fixedly secured onto the bottom wall;
the case also has an upper wall portion, placed over the substrate, which carries thereon an electric circuit element; and
the upper layer gel is filled in the case so as to cover at least a part of the base.

6. The electric circuit device according to claim 1, wherein:
the upper layer gel and the lower layer gel include silicone gel.

7. The electric circuit device according to claim 5, wherein:
the base includes a bus bar that is electrically connected to the electric circuit element carried on the base and at least one of the electric circuit elements mounted on the substrate.

8. The electric circuit device according to claim 5, wherein:
the substrate is fixedly secured onto the bottom wall of the case by an adhesive.

9. The electric circuit device according to claim 7, wherein:
the base has a window opening formed in an area adjacent to the electric circuit element carried on the base; and
the bus bar has an end portion, exposed to the window portion, which is electrically connected to the electric circuit element carried on the base.

10. An electric circuit device comprising:
a case;
a substrate on which electric circuit elements are mounted and which is mounted in the case; and
a sealant, filled in the case to cover the electric circuit elements and the substrate, which takes a two-layer structure having a lower layer gel and an upper layer gel;
wherein the upper layer gel has a penetration equal to or less than 90 and the lower layer gel has a penetration equal to or greater than 100 and equal to or less than 130.

11. An electric circuit device comprising:
a case;
a substrate on which electric circuit elements are mounted in a first group and which is mounted in the case;
a sealant, filled in the case to cover the electric circuit elements and the substrate, which takes a two-layer structure having a lower layer gel and an upper layer gel; and
a resin base fixedly mounted in the case in an area straddling the first group of electric circuit elements and the substrate and including sidewalls extending through the upper and lower layer gels of the sealant and an element mounting portion supported with at least one of the sidewalls for fixedly supporting thereon an electric circuit element belonging to a second group at a position covered with the upper layer gel;
wherein the upper layer gel has a penetration equal to or less than 90 and the lower layer gel has a penetration equal to or greater than 100 and equal to or less than 130.

* * * * *